(12) United States Patent
Rangarajan et al.

(10) Patent No.: US 6,537,881 B1
(45) Date of Patent: Mar. 25, 2003

(54) PROCESS FOR FABRICATING A NON-VOLATILE MEMORY DEVICE

(75) Inventors: Bharath Rangarajan, Santa Clara, CA (US); David Foote, San Jose, CA (US); Fei Wang, San Jose, CA (US); Steven K. Park, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/688,504

(22) Filed: Oct. 16, 2000

(51) Int. Cl.⁷ ............... H01L 21/3105; H01L 21/335; H01L 21/8247
(52) U.S. Cl. .......... 438/261; 438/257; 438/763; 438/591
(58) Field of Search ............... 438/257, 261, 438/763, 792, 795, FOR 203, FOR 333, FOR 334, FOR 401, FOR 434, 4, 516, 216, 591, FOR 202

(56) References Cited

U.S. PATENT DOCUMENTS

| | | | | |
|---|---|---|---|---|
| 5,290,727 A | * | 3/1994 | Jain et al. | 438/238 |
| 5,843,817 A | * | 12/1998 | Lee et al. | 438/239 |
| 6,074,917 A | * | 6/2000 | Chang et al. | |
| 6,197,636 B1 | * | 3/2001 | Park et al. | |
| 6,204,203 B1 | * | 3/2001 | Narwankar et al. | 438/785 |
| 6,259,133 B1 | * | 7/2001 | Gardner et al. | 257/315 |
| 6,284,580 B1 | * | 9/2001 | Takehiro | 438/197 |

\* cited by examiner

Primary Examiner—George Fourson

(57) ABSTRACT

A process for fabricating a non-volatile memory device in which extraneous electrical charge is removed from charge-storage layers during fabrication includes exposing a charge-storage layer to infrared radiation prior to forming additional layers of the non-volatile memory cell. For example, in a memory cell incorporating a dielectric floating-gate electrode, such as silicon nitride, the infrared radiation exposure step is carried out after forming the floating-gate electrodes and prior to formation of the control-gate electrode. By exposing the charge-storage layer to infrared radiation prior to forming additional layers, extraneous electrical charge arising from previous processing steps can be efficiently removed from the floating-gate electrodes.

18 Claims, 2 Drawing Sheets

PROCESS FOR FABRICATING A NON-VOLATILE MEMORY DEVICE

FIELD OF THE INVENTION

This invention relates, generally, to the fabrication of semiconductor devices and, more particularly, to the fabrication of non-volatile memory devices such as EEPROM devices, and the like.

BACKGROUND OF THE INVENTION

Non-volatile memory devices are currently in widespread use in to electronic components that require the retention of information when electrical power is terminated. Non-volatile memory devices include read-only-memory (ROM), programmable-read-only memory (PROM), erasable-programmable-read-only-memory (EPROM), and electrically-erasable-programmable-read-only-memory (EEPROM) devices. EEPROM devices differ from other non-volatile memory devices in that they can be electrically programmed and erased. Flash EEPROM devices are similar to EEPROM devices in that memory cells can be programmed and erased electrically. However, Flash EEPROM devices enable the erasing of all memory cells in the device using a single electrical current pulse.

Typically, an EEPROM device includes a floating-gate electrode upon which electrical charge is stored. The floating-gate electrode overlies a channel region residing between source and drain regions in a semiconductor substrate. The floating-gate electrode together with the source and drain regions forms an enhancement transistor. By storing electrical charge on the floating-gate electrode, the threshold voltage of the enhancement transistor is brought to a relatively high value. Correspondingly, when charge is removed from the floating-gate electrode, the threshold voltage of the enhancement transistor is brought to a relatively low value. The threshold level of the enhancement transistor determines the current flow through the transistor when the transistor is turned on by the application of appropriate voltages to the gate and drain. When the threshold voltage is high, no current will flow through the transistor, which is defined as a logic 0 state. Correspondingly, when the threshold voltage is low, current will flow through the transistor, which is defined as a logic 1 state.

Since the operation of an EEPROM device depends upon the presence or absence of charge on the floating-gate electrode, memory manufacturers typically take steps to ensure that all memory cells are erased prior to shipment of memory devices to customer. Typically the data-erase operation involves applying appropriate erase voltages to the memory array in order remove electrical charge from the floating-gate electrodes in the array. It is important that no electrical charge remain on any floating-gate electrode in a memory array prior to shipment. Extraneous charge in the memory array can result in programming errors and other operational anomalies.

Advances in EEPROM device technology have led to the use of certain dielectric materials for the fabrication of floating-gate electrodes. For example, advanced EEPROM devices can be fabricated with silicon nitride floating-gate electrodes. Silicon nitride is among a group of dielectric materials that possess the capability to store electrical charge in isolated regions within the dielectric material. The ability of silicon nitride to store electrical charge in isolated regions has led to its use in advance EEPROM technology, such as two-bit non-volatile memory devices.

Although the ability of materials, such as silicon nitride and the like, to store electrical charge in isolated regions has enabled the fabrication of advanced EEPROM devices. Memory cells incorporating silicon nitride as a charge storage layer must be carefully fabricated. The storage and removal of electrical charge from isolated regions of a single layer of silicon nitride in an EEPROM memory cell requires that adequate steps to taken to ensure that extraneous electrical charge does not inadvertently remain on floating-gate electrodes prior to device shipment. According, advances in non-volatile fabrication technology are necessary to ensure proper programming and operation of non-volatile memory devices incorporating floating-gate electrodes fabricated with dielectric materials.

SUMMARY OF THE INVENTION

The present invention is for a process for fabricating a non-volatile memory device in which extraneous electrical charge is removed from charge-storage layers during fabrication of the non-volatile memory device. By taking steps to remove electrical charge from charge-storage wires during device fabrication, extraneous electrical charge induced during fabrication can be efficiently removed. For example, extraneous electrical charge can be generated by conventional processing operations, such as chemical-vapor-deposition (CVD), plasma etching and the like. The process of the present invention efficiently removes process-induced electrical charge by exposing the charge-storage layer to infrared radiation during device fabrication. The inventive process incorporates infrared radiation exposure of the charge-storage layer at a point in the process prior to the formation of overlying layers, such as control-gate electrodes, interlevel dielectric layers, metal interconnect layers, and the like. By exposing the charge-storage layer at an intermediate point in the fabrication process, a high efficiency charge removal methodology is realized.

In one form, a process is provided in which a charge-storage layer is formed to overlie a semiconductor substrate. The charge-storage layer has exposed surface regions which are bombarded by infrared radiation to remove electrical charge from the charge-storage layer.

Figure 1:
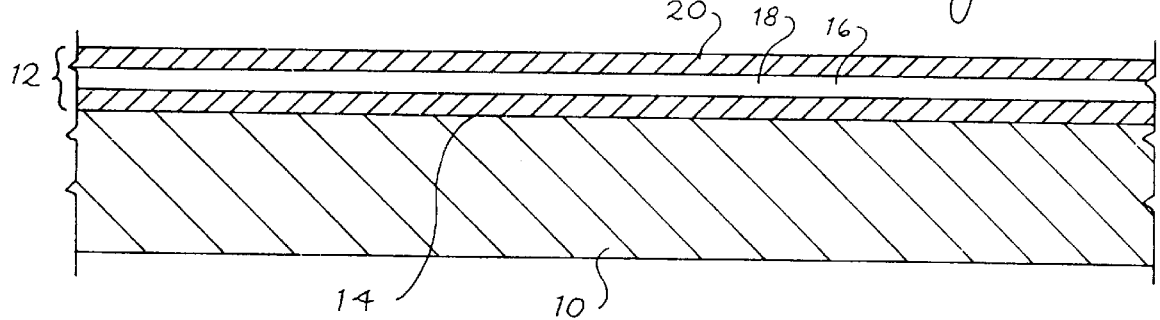
FIGS. 1–5 illustrate, in cross-section, processing steps in accordance with one embodiment of the invention.

It will be appreciated that, for simplicity and clarity of illustration, elements shown in the Figures have not necessarily been drawn to scale. For example, the dimensions of some of the elements are exaggerated relative to each other. Further, where considered appropriate, reference numerals have been repeated among the Figures to indicate corresponding elements.

DETAILED DESCRIPTION OF PREFERRED EMBODIMENTS

FIG. 1 illustrates a cross-section view of a portion of a semiconductor substrate 10 having already undergone several processing steps in accordance with the invention. An ONO layer 12 overlies a principal surface 14 of semiconductor substrate 10. ONO layer 12 includes a first silicon oxide layer 16 overlying principal surface 14, a silicon nitride layer 18 overlying first silicon oxide layer 16, and a second silicon oxide layer 20 overlying silicon nitride layer 18. In accordance with the invention, ONO layer 12 can be fabricated by a variety of fabrication techniques. For example, first silicon oxide layer 16 can be thermally grown on principal surface 14, followed by a CVD silicon nitride deposition process and a CVD silicon oxide deposition process. Alternatively, after thermally growing first silicon oxide layer 16 and forming silicon nitride layer 18 by CVD, a thermal oxidation process can be carried out to grow second silicon oxide layer 20 on silicon nitride layer 18. In yet another ONO formation process, ONO layer 12 can be formed by first growing or depositing a thick silicon oxide layer followed by a nitrogenation process in which nitrogen is incorporated into the silicon oxide layer. The nitrogen can be incorporated by a nitrogen annealing process, nitrogen ion implantation and the like.

In the present embodiment, ONO layer 12 and, in particular, silicon nitride layer 18, will function as a floating-gate electrode in an EEPROM device. Accordingly, the fabrication of ONO layer 12 is carefully performed to ensure that a high quality silicon nitride layer is fabricated. Silicon nitride layer 18 will be used to store electrical charge in isolated regions of the silicon nitride layer during operation of the memory device.

Figure 2:
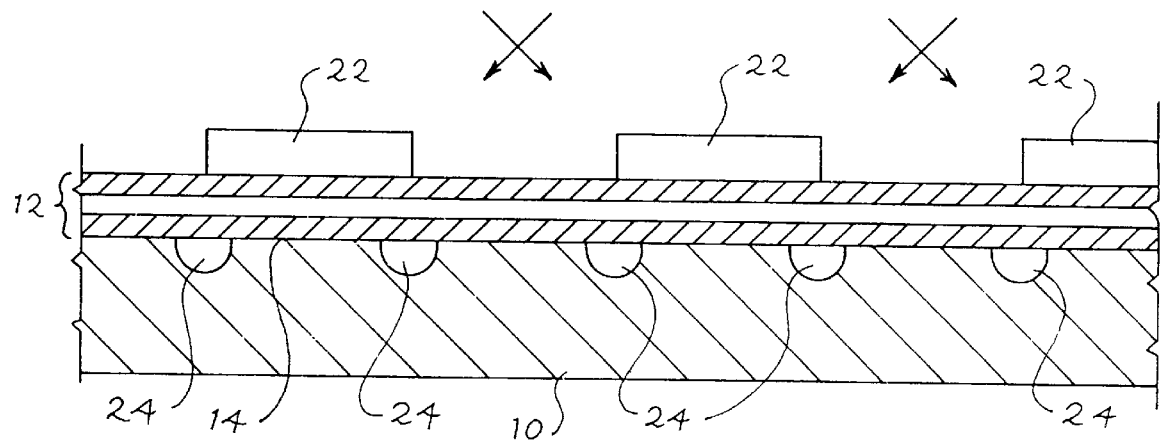

Following the formation of ONO layer 12, a patterned resist layer 22 is formed on the surface of second silicon oxide layer 20, as illustrated in FIG. 2. Patterned resist layer 22 can be formed with a variety of resist materials commonly used in semiconductor fabrication. For example, patterned resist layer 22 can be formed by depositing a layer of positive photoresist, followed by exposure of the resist to optical radiation and subsequent development in a developer solution. Alternatively, patterned resist layer 22 can be formed by depositing a deep-UV resist followed by exposure to UV radiation and subsequent chemical development. Additionally, patterned resist layer 22 can be formed by deposition of an X-ray resist material, followed by exposure to X-ray radiation and chemical development.

After forming patterned resist layer 22, pocket regions 24 are formed in semiconductor substrate 10. Pocket regions 24 are formed to partially underlie the sections of patterned resist layer 22. In a preferred embodiment, pocket regions 24 are formed by an angled ion implantation process. The angled ion implantation process is carried out at an offset angle with respect to the normal of principal surface 14. By implanting at an offset angle of incidence, dopant atoms can be placed in semiconductor substrate 10 in regions underlying the edges of the sections of patterned resist layer 22. Preferably, pocket regions 24 are p-type regions formed by the angled ion implantation of boron.

Figure 3:
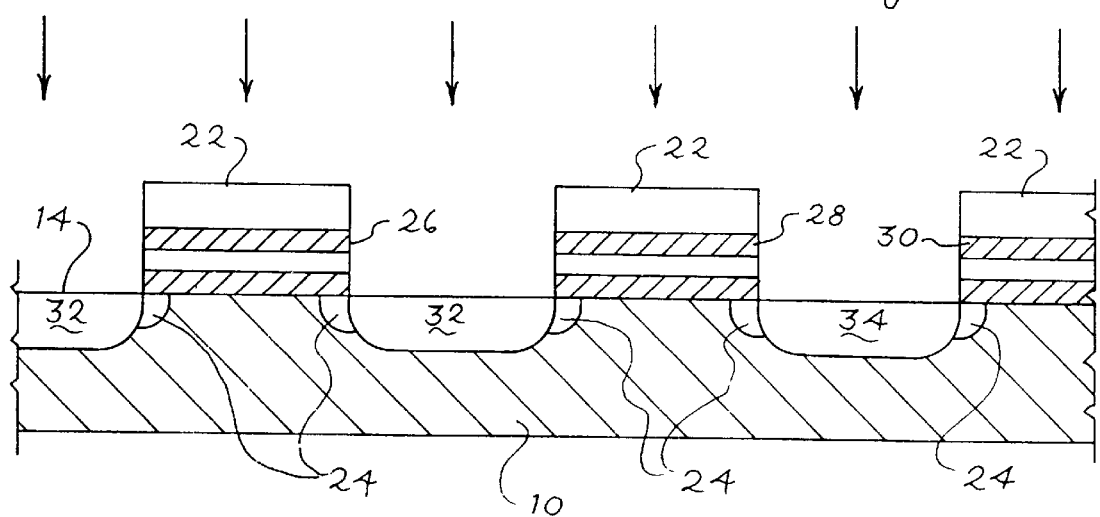

Once pocket regions 24 are formed, an etching process is carried out to form floating-gate electrodes 26, 28 and 30, as illustrated in FIG. 3. Preferably, floating-gate electrodes 26, 28 and 30 are formed by anisotropic etching of ONO layer 12. The anisotropic etching process directionally etches ONO layer 12, such that floating-gate electrodes 26, 28 and 30 are formed to have substantially vertical sidewalls.

After forming the floating-gate electrodes, a doping process is carried out to form buried bit-lines 32 and 34 in semiconductor substrate 10. In a preferred embodiment of the invention, buried bit-lines 32 and 40 are formed by ion plantation into semiconductor substrate 10 using patterned resist layer 22 as a doping mask. Upon completion of the doping process, buried bit-lines 32 and 34 reside in semiconductor substrate 10, such that pocket regions 24 lie adjacent to a portion of the perimeter of buried bit-lines 32 and 34.

Those skilled in the art will recognize that the process used to form pocket regions 24 and buried bit-lines 32 and 34 can be different from that just described. For example, buried bit-lines 32 and 34 can be formed prior to forming pocket regions 24. In another alternative process, ONO layer 12 can be etched prior to forming pocket regions 24. In yet another alternative process, buried bit-lines 32 and 34 can be formed prior to etching ONO layer 12. Accordingly, all such process variations are within the scope of the present invention.

In a preferred embodiment of the invention, pocket regions 24 are formed by ion implantation of boron at a dose of about 0.2E13 ions/cm$^2$ to about 4.5E13 ions/cm$^2$ and at an implant energy of about 20 keV to about 200 keV. Also, buried bit-lines 32 and 34 are preferably formed by ion implantation of arsenic at a dose of about 1E 15 ions/cm$^2$ to about 12E 15 ions/cm$^2$ and at an implant energy of about 15 keV to about 180 keV. Additionally, in a preferred embodiment, first oxide layer 16 is formed to a thickness of about 40 angstroms to about 60 angstroms, and first oxide layer 16 is not removed by the ONO etching process until after formation of buried bit-lines 32 and 34.

After removing resist mass 22, bit-line oxide regions 36 and 38 are formed in semiconductor substrate 10. Preferably, bit-line oxide regions 36 and 38 are formed by a thermal oxidation process using the floating-gate electrode as an oxidation mass. Those skilled in the art will recognize that ONO structures, such as ONO layer 12, are resistant to thermal oxidation such that regions of semiconductor substrate 10 underlying the floating-gate electrodes will be protected from the thermal oxidation process.

Figure 4:
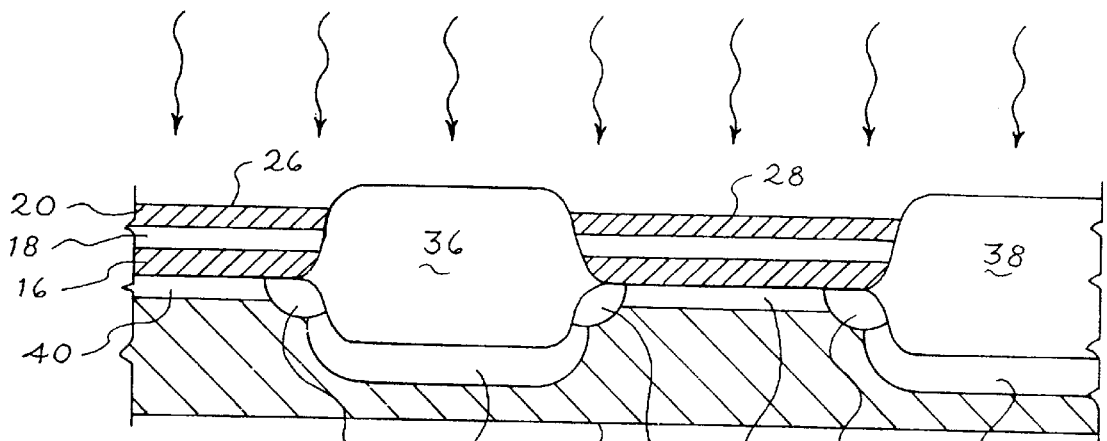

In accordance with the invention, after forming buried bit-lines 32 and 34, resist layer 22 is removed and the floating-gate electrodes are exposed to infrared radiation, as illustrated in FIG. 4. In a preferred embodiment of the invention, the floating-gate electrodes are exposed to infrared radiation having a wavelength of about 600 nm to about 1100 nm, more preferably about 800 nm to about 1000 nm. Any extraneous electrical charge present in silicon nitride layer 18 is removed by exposure to infrared radiation.

Extraneous electrical charge can arise from several sources, for example, during the previously described processing steps, electrical charge can become trapped in silicon nitride layer 18. The extraneous electrical charge can arise in silicon nitride layer 18 during CVD processing, plasma etching, ion implantation and the like. By performing a infrared radiation exposure step at a point in time prior to forming additional layers, such as dielectric layers, control-gate electrodes, and the like, over the floating-gate electrodes, a highly efficient charge removal process is realized. As illustrated in FIG. 4, the infrared radiation only needs to penetrate second oxide layer 20 in order to bathe silicon nitride layer 18 in radiation.

The importance of removing electrical charge from the floating-gate electrodes, such as floating-gate electrodes 26 and 28, is important in view of the close proximity of the floating-gate electrode to channel regions 40 and 42 in semiconductor substrate 10. During operation of an EEPROM memory cell, electrical charge is injected into silicon nitride layer 18 from pocket regions 24. For proper operation of an EEPROM memory device, such as a 2-bit memory device, the electrical charge injected into silicon nitride layer 18 must remain in isolated regions in close proximity to the pocket regions. Once this is accomplished, the electrical field experienced by channel regions 40 and 42 will vary depending upon the presence or absence of charge in the isolated regions of silicon nitride layer 18. Given the extremely small feature sizes to which state-of-the-art EEPROM devices are fabricated, even an extremely small amount of unwanted electrical charge can severely disrupt the electrical field established by the floating-gate electrodes in channel regions 40 and 42. The process of the invention maximizes the removal of extraneous electrical charge by exposing silicon nitride layer 18 to infrared radiation at an intermediate point in the non-volatile memory fabrication process.

Figure 5:
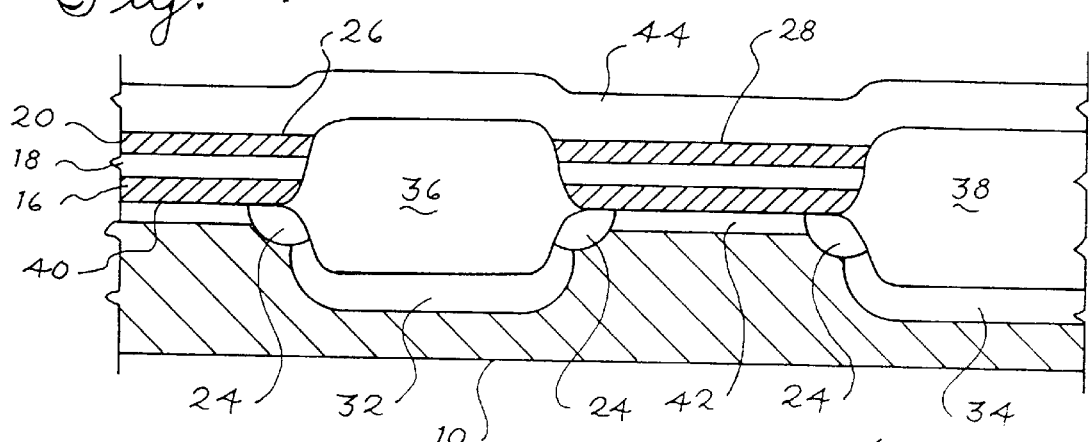

As illustrated in FIG. 5, once extraneous charge has been removed from the floating-gate electrodes, a control-gate electrode 44 is formed. Preferably, control-gate electrode 44 is formed by depositing a layer of polycrystalline silicon by a CVD process, followed by patterning and etching to form thin control-gate lines overlying the substrate. Control-gate electrode 44 overlies the floating-gate electrodes 26 and 28, and bit-line oxide regions 36 and 38. In accordance with the invention, additional infrared radiation exposure steps can be carried out at selected stages of the non-volatile memory fabrication process. Accordingly, a second infrared radiation exposure step can be carried out after forming floating-gate electrode 44. In addition to removing electrical charge from dielectric materials such as silicon nitride 18, the infrared radiation exposure step can remove electrical charge from electrically conductive materials, such as polycrystalline silicon forming control-gate electrode 44. Accordingly, the present invention is not limited to removal of electrical charge from floating-gate electrodes fabricated with insulating materials and can beneficially be employed in the fabrication of non-volatile memory devices having polycrystalline silicon floating-gate electrodes.

Figure 6:
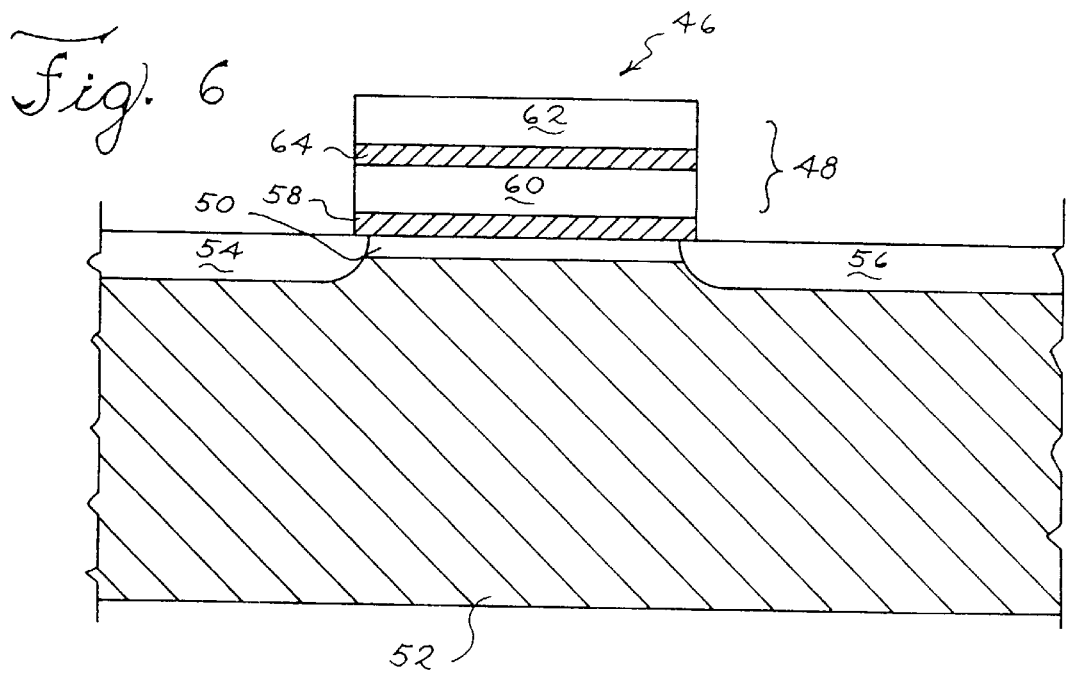
FIG. 6 illustrates, in cross-section, a non-volatile memory device having a stacked-gate electrode fabricated in accordance with the invention.

Shown in FIG. 6 is a cross-sectional view of a non-volatile memory device 46 having a stacked-gate electrode structure 48. Stacked-gate electrode structure 48 overlies a channel region 50 formed in a semiconductor substrate 52. A source region 54 and a drain region 56 reside in semiconductor substrate 52 and are separated by channel region 50. Stacked-gate electrode structure 48 includes a first gate dielectric layer 58 overlying channel region 50 and a floating-gate electrode 60 overlying gate dielectric layer 58. A control-gate electrode 62 is separated from floating-gate electrode 60 by an inter-gate dielectric layer 64.

In accordance with the invention, following the deposition and etching process used to form floating-gate electrode 60, an infrared exposure step is carried out to remove extraneous electrical charge from floating-gate electrode 60. Floating-gate electrode 60 can be formed from a variety of semiconductive materials, such as polycrystalline silicon, refractory metal silicides, amorphous silicon and the like. The infrared exposure process can be advantageously employed to remove extraneous electrical charge from semiconductive materials used to form a floating-gate electrode.

Thus, it is apparent that there has been described, in accordance with the invention, a process for fabricating a non-volatile memory device that fully provides the advantages set forth above. Although the invention has been described and illustrated with reference to specific, illustrative embodiments thereof, it is not intended that the invention be limited to those illustrative embodiments. Those skilled in the art will recognize that variations and modifications can be made without departing from the spirit of the invention. For example, in addition to the non-volatile memory devices illustrated above, the process of the invention can be carried out to fabricate single-poly non-volatile memory cells. Single-poly non-volatile memory cells are often employed in the memory arrays of standard logic devices, microcontroller devices and the like. It is, therefore, intended to include within the invention all such variations and modifications as fall within the scope of the appended claims and equivalents thereof.

What is claimed is:

1. A process for fabricating a non-volatile memory device comprising the steps of:

providing a semiconductor substrate;

forming a charge-storage layer overlying the semiconductor substrate;

wherein the charge-storage layer has an exposed surface region;

forming a buried bit-line in the semiconductor substrate; and after the buried bit-line is formed, bombarding the exposed surface region with sufficient infrared radiation to remove unwanted electrical charge from the charge-storage layer.

2. The process of claim 1, wherein the step of forming a charge-storage layer comprises forming an silicon nitride layer.

3. The process of claim 1, wherein the step of forming a charge-storage layer comprises the steps of:

forming a first silicon oxide layer overlying the substrate;

forming a silicon nitride layer overlying the first silicon oxide layer; and forming a second silicon oxide layer overlying the silicon nitride layer.

4. The process of claim 3, wherein the step of bombarding the charge-storage layer with infrared radiation comprises removing unwanted electrical charge from the silicon nitride layer.

5. The process of claim 1, wherein the step of forming the charge-storage layer comprises the steps of:

chemical vapor depositing an ONO layer;

forming a resist pattern on the ONO layer; and plasma etching the ONO layer.

6. The process of claim 1, wherein the step of bombarding the exposed surface region with infrared radiation comprises using infrared radiation having a wavelength of about 600 nm to about 1100 nm.

7. The process of claim 1, wherein the process of forming a charge-storage layer comprises forming a polycrystalline silicon layer.

8. The process of claim 1, further comprising the step of forming a control gate electrode overlying the charge-storage layer.

9. A process for fabricating a non-volatile memory device comprising the steps of:

providing a semiconductor substrate;

forming a change-storage layer overlying the semiconductor substrate;

forming a resist pattern on the charge-storage layer;

etching the charge-storage layer;

removing the resist pattern;

forming a buried bit-line in the semiconductor substrate; and after the buried bit-line is formed, exposing the charge-storage layer to sufficient infrared radiation to remove unwanted electrical charge from the charge-storage layer.

10. The process of claim 9, wherein the step of forming a charge-storage layer comprises forming a silicon nitride layer.

11. The process of claim 9, wherein the step of forming a charge-storage layer comprises forming a polycrystalline silicon layer.

12. The process of claim 9 further comprising the step of forming a control-gate electrode overlying the charge-storage layer.

13. The process of claim 12, wherein the step of forming a control-gate electrode comprises forming an insulating layer; and forming a layer of polycrystalline silicon layer overlying the insulating layer.

14. The process of claim 9, wherein the step of etching the charge-storage layer exposes surface regions of the semiconductor substrate and wherein the process further comprises the step of forming bit-line oxide regions on the semiconductor substrate prior to the step of exposing the charge-storage layer to infrared radiation.

15. A process for fabricating a non-volatile semiconductor device comprising the steps of:

providing a semiconductor substrate;

forming a charge-storage layer overlying the semiconductor substrate;

forming a buried bit-line in the semiconductor substrate;

after the buried bit-line is formed, exposing the charge-storage layer to sufficient infrared radiation to remove unwanted electrical charge from the charge-storage layer; and forming a control-gate layer overlying the charge-storage layer.

16. The process of claim 15 wherein the step of forming a charge-storage layer comprises forming a patterned charge storage layer on a portion of the semiconductor substrate and leaving an exposed portion of the substrate, and wherein the process further comprises forming an oxide region in the exposed portion of the substrate.

17. The process of claim 15, wherein the step of forming a charge-storage layer comprises depositing a layer selected from the group consisting of silicon nitride and polycrystalline silicon.

18. The process of claim 15, wherein the step of forming a charge-storage layer comprises forming a layer having process-induced electrical charge therein.

* * * * *